(12) United States Patent
Chai et al.

(10) Patent No.: US 7,876,631 B2
(45) Date of Patent: Jan. 25, 2011

(54) SELF-TUNING OF SIGNAL PATH DELAY IN CIRCUIT EMPLOYING MULTIPLE VOLTAGE DOMAINS

(75) Inventors: Chiaming Chai, Chapel Hill, NC (US); Stephen Edward Liles, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 196 days.

(21) Appl. No.: 12/336,741

(22) Filed: Dec. 17, 2008

(65) Prior Publication Data
US 2010/0148839 A1 Jun. 17, 2010

(51) Int. Cl.
*G11C 7/00* (2006.01)
(52) U.S. Cl. ............ 365/194; 365/189.12; 365/207
(58) Field of Classification Search ........ 365/194, 365/189.12, 207, 189.112
See application file for complete search history.

(56) References Cited

U.S. PATENT DOCUMENTS

| | | | |
|---|---|---|---|
| 6,031,779 A | | 2/2000 | Takahashi |
| 6,034,920 A | * | 3/2000 | Sukegawa et al. ........ 365/233.5 |
| 7,542,332 B1 | * | 6/2009 | Kim ........................ 365/154 |
| 7,542,348 B1 | * | 6/2009 | Kim ........................ 365/185.21 |
| 2006/0220721 A1 | | 10/2006 | Vig |
| 2008/0056031 A1 | | 3/2008 | Takahashi |

OTHER PUBLICATIONS

International Search Report-PCT/ US2010/067657, International Search Authority-European Patent Office May 31, 2010.
Written Opinion-PCT/ US2010/067657, International Search Authority-European Patent Office May 31, 2010.

* cited by examiner

*Primary Examiner*—Son Dinh
*Assistant Examiner*—Nam Nguyen
(74) *Attorney, Agent, or Firm*—Nicholas J. Pauley; Peter M. Kamarchik; Jonathan T. Velasco

(57) ABSTRACT

Circuits and methods provided in multiple voltage domains that include self-tuning or timing of a signal path are disclosed. A plurality of paths is provided in the circuit. Each path traverses a portion of the multiple voltage domains, which may include any number or combination of the multiple voltage domains. Each of the paths has a delay responsive to at least one of the plurality of voltage domains. A delay circuit is provided and configured to generate a delay output related to the delay in the plurality of paths. In this manner, the delay output of the delay circuit is self-tuned or adjusted according to the delay in the plurality of paths. This self-tuning may be particularly suited to control the delay of a first signal path relative to a second signal path wherein the delay in the paths can vary with respect to each other during operation.

24 Claims, 6 Drawing Sheets

SELF-TUNING OF SIGNAL PATH DELAY IN CIRCUIT EMPLOYING MULTIPLE VOLTAGE DOMAINS

BACKGROUND

I. Field of the Disclosure

The technology of the disclosure relates generally to timing of one or more signal paths in a multiple voltage domain circuit. The technology of the disclosure also relates to timing of one or more signal paths in memory circuits.

II. Background

Circuits are increasingly being designed with conservation of power in mind. This is particularly the case for portable electronic devices that are battery-powered. Common examples include mobile phones and laptop computers among others. Increased power consumption undesirably results in faster battery drain and shorter battery life. One method of conserving power is to lower the operating frequency of the circuit according to the active power equation $P=CV^2f$. However, reducing operating frequency results in lower circuit performance (i.e., speed). Another method of conserving power is to lower the operating voltage level since generally, active power reduces quadratically for a given reduction in operating voltage level. However, lowering the operating voltage level in a circuit lowers speed performance, which may also be undesirable. Further, certain cells or components of a circuit may have a minimum operating voltage below which they will not operate properly.

To address the tradeoff between performance and power consumption, multiple operating voltage domains ("voltage domains") are increasingly being provided in circuits. Circuit paths are provided which pass through the multiple voltage domains to provide different operating voltages to different components of a circuit. Providing multiple voltage domains allows a lower voltage domain to provide power to components that do not require minimum voltage levels to conserve power. Components that either have a minimum operating voltage level for proper operation or provide critical paths where performance cannot be sacrificed may be powered by the higher voltage domain. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

Examples of circuits where multiple voltage domains are commonly employed are memory circuits and memory systems. One example is static random access memory (SRAM). SRAM may be used on cache memory. SRAM cells have a minimum operating voltage level to retain stability and properly retain data. Further, the minimum operating voltage is higher to address minimum operating voltage level issues for SRAM cells provided in deep sub-micron geometries less than one-hundred (100) nanometers (nm), such as sixty-five (65) nm and forty-five (45) nm geometries as examples. One example of an SRAM system employing multiple voltage domains is illustrated in FIG. 1. Therein, an exemplary SRAM memory system 10 (referred to as "memory system 10") is provided. Input lines 12 and output lines 14 are coupled to the memory system 10. The input lines 12 and output lines 14 carry signals to allow command and data communication between the memory system 10 and other system components that write or read data to and from an SRAM cell array 16, which operates as a mass memory device. A control system 18 controls the operation of the SRAM cell array 16.

The memory system 10 contains two signal paths, labeled "access path" 20 and "sense path" 22. The access path 20 transfers access signals from the control system 18 to word line drivers 26 (i.e., row selector), possibly through intermediary logic 24. In response, the word line drivers 26 activate a specific row of memory cells within the SRAM cell array 16 in response to address information from the control system 18. The address information identifies a specific row in the SRAM cell array 16 to be selected. The row may be selected for either a read or write operation. In response, data from the selected row in the SRAM cell array 16 is placed on bit lines 28. In order to read the data placed on the bit lines 28, the control system 18, and possibly intermediary logic 30, communicates a sense signal to sense amplifiers 32 to perform a read on the bit lines 28. The sense amplifiers 32 sense the data from the bit lines 28 and place the data on output lines 14.

In the memory system 10, the timing for signals to traverse the access path 20 and the sense path 22 are compatible. Specifically, the memory system 10 is designed so that a sense pulse signal communicated by the control system 18 over the sense path 22 does not cause the sense amplifiers 32 to sense data on the bit lines 28 before access signals are communicated by the control system 18 over the access path 20 to cause the SRAM cell array 16 to assert data on the bit lines 28. Otherwise, the sense amplifiers 32 will sense data on the bit lines 28 before the SRAM cell array 16 has asserted valid data on the bit lines 28. It is acceptable for access signals communicated over the access path 20 to reach the SRAM cell array 16 before sense signals reach the sense amplifiers 32 over the sense path 22. In this scenario, data on the bit lines 28 will be present before the sense amplifiers 32 are activated to sense data on the bit lines 28. The delay of the access path 20 in the memory system 10 provides the minimum delay for which sense signals should traverse the sense path 22 to the sense amplifiers 32.

The memory system 10 of FIG. 1 operates in a higher voltage domain $V_H$ provided at the minimum voltage level $V_{MIN}$ sufficient to provide stable operation and data storage in the SRAM cell array 16. The input lines 12 and output lines 14 come from components that are provided in a lower voltage domain $V_L$. In this regard, one or more level shifters 34 are provided to convert the signals on the input lines 12 from the lower voltage domain $V_L$ to the higher voltage domain $V_H$. Signals communicated from the sense amplifiers 32 to the output lines 14 may be converted from the higher voltage domain $V_H$ to the lower voltage domain $V_L$ with or without one or more level shifters 36.

It may be desirable to power certain components or portions of the memory system 10 in a lower voltage domain $V_L$. Providing multiple voltage domains in a circuit allows scaling of a voltage domain to conserve power without affecting the operation of the components powered by other voltage domain(s). However, because different voltage domains operate independently, the voltage level differential between them can vary. Variations in voltage levels between different voltage domains can cause discrepancies in delays of signal paths in a circuit. Large discrepancies may render the circuit non-functional.

SUMMARY OF THE DISCLOSURE

Embodiments disclosed in the detailed description include circuits and methods provided in multiple voltage domains that include self-tuning or timing of a signal path. In this regard, a plurality of paths is provided in the circuit. Each path traverses a portion of the multiple voltage domains, which may include any number or combination of the multiple voltage domains. Each of the paths has a delay responsive to at least one of the plurality of voltage domains. A delay circuit is provided and configured to generate a delay output related to the delay in the plurality of paths. In this manner, the delay output of the delay circuit is self-tuned or adjusted according to the delay in the plurality of paths. This self-tuning may be suited for use in circuits and methods where it is desired to control the delay of a first signal path relative to a second signal path, and the timings in the paths can vary with respect to each other due to delay variations caused by voltage level variations among multiple voltage domains.

In certain embodiments disclosed herein, a first path is provided that traverses a first portion of the plurality of voltage domains. The first portion is a subset of the plurality of voltage domains that may consist of any number or combination of the plurality of voltage domains. A second path is provided that traverses a second portion of the plurality of voltage domains. The second portion is also a subset of the plurality of voltage domains that may consist of any number or combination of the plurality of voltage domains. A delay circuit is coupled to the first path. The delay circuit includes at least one first delay element whose voltage is configured to be supplied by a first voltage supplied by the first portion among the plurality of voltage domains and at least one second delay element whose voltage is configured to be supplied by a second voltage supplied by the second portion among the plurality of voltage domains. In this manner, the delay circuit, by including delay elements being supplied with voltage from both the first and second portions among the plurality of voltage domains, will track delay changes in the second portion caused by variations among the plurality of voltage domains. The delay circuit generates a delay output in response to the greater delay between the first portion and the second portion among the plurality of voltage domains.

The circuits and methods disclosed herein may be employed in memory systems where the timing or delay of an access path and sense path are controlled to access memory. These memory systems include those included in processor-based systems. For example, the circuits and methods disclosed herein may be employed in a memory system employing static random access memory (SRAM). The memory system may be designed such that certain components are included in a lower voltage domain to conserve power, while the SRAM is included in a higher voltage domain to provide a minimum operating voltage level for cell operation. The memory system includes an access path to cause the SRAM to assert data onto bit lines and a sense path to control when sense amplifiers sense the bit lines. Changes in voltage levels between the higher and lower voltage domains can change the delay of the access path and the sense path. In this regard, at least one delay element whose voltage is supplied by both the higher voltage domain and the lower voltage domain is provided in the sense path. In this manner, the at least one delay element adjusts or self-tunes the delay of the sense path according to the path having the greater delay among the lower and higher voltage domains so that the sense amplifiers do not sense the bit lines before the SRAM asserts valid data on the bit lines.

DETAILED DESCRIPTION

Figure 1:
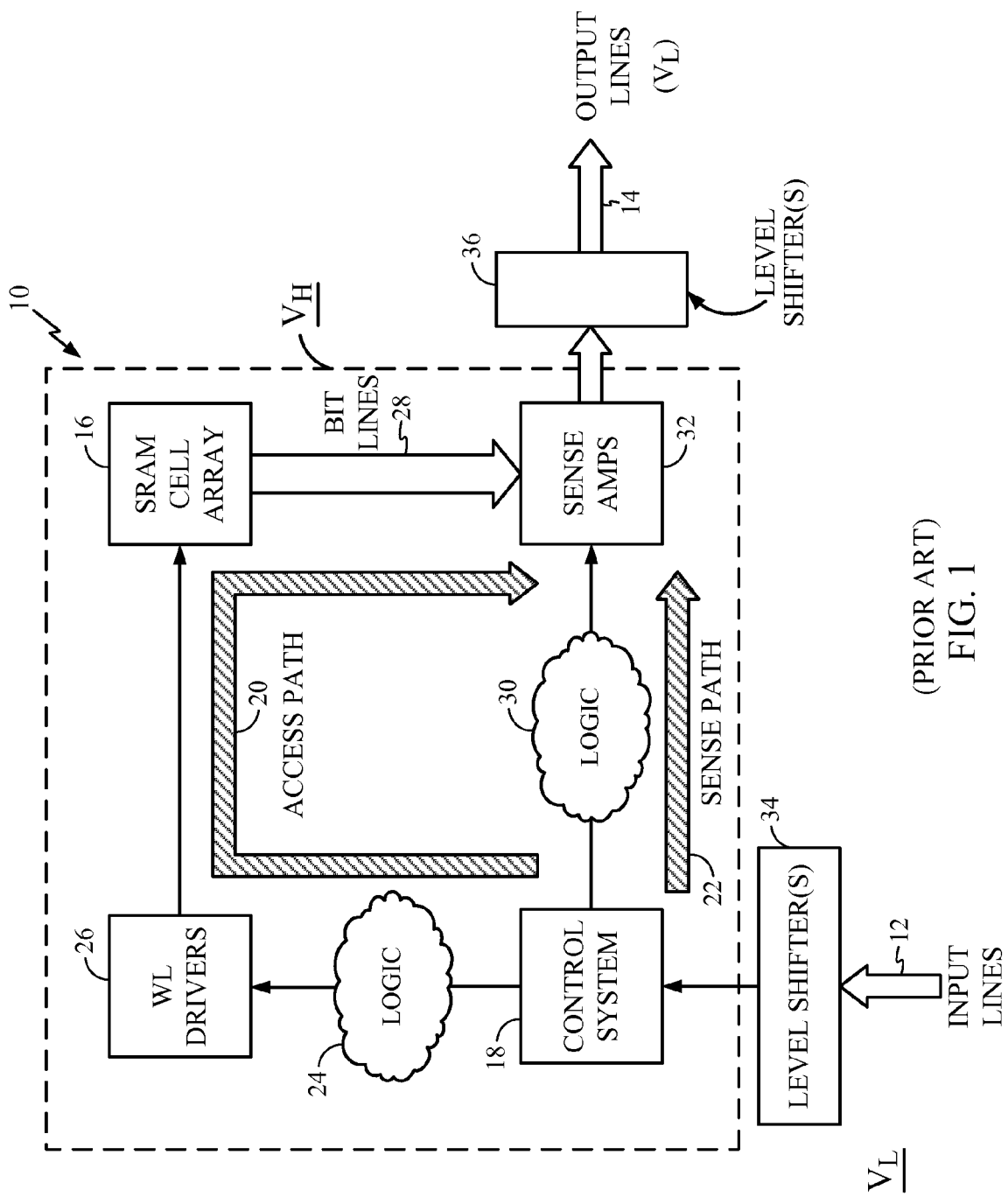
FIG. 1 is a block diagram of an exemplary memory circuit and system.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include circuits and methods provided in multiple voltage domains that include self-tuning or timing of a signal path. In this regard, a plurality of paths is provided in the circuit. Each path traverses a portion of the multiple voltage domains, which may include any number or combination of the multiple voltage domains. Each of the paths has a delay responsive to at least one of the plurality of voltage domains. A delay circuit is provided and configured to generate a delay output related to the delay in the plurality of paths. In this manner, the delay output of the delay circuit is self-tuned or adjusted according to the delay in the plurality of paths. This self-tuning may be suited for use in circuits and methods where it is desired to control the delay of a first signal path relative to a second signal path, and the timings in the paths can vary with respect to each other due to delay variations caused by voltage level variations among multiple voltage domains.

In certain embodiments disclosed herein, a first path is provided that traverses a first portion of the plurality of voltage domains. The first portion is a subset of the plurality of voltage domains that may consist of any number or combination of the plurality of voltage domains. A second path is provided that traverses a second portion of the plurality of voltage domains. The second portion is also a subset of the plurality of voltage domains that may consist of any number or combination of the plurality of voltage domains. A delay circuit is coupled to the first path. The delay circuit includes at least one first delay element whose voltage is configured to be supplied by a first voltage supplied by the first portion among the plurality of voltage domains and at least one second delay element whose voltage is configured to be supplied by a second voltage supplied by the second portion among the plurality of voltage domains. In this manner, the delay circuit, by including delay elements being supplied with voltage from both the first and second portions among the plurality of voltage domains, will track delay changes in the second portion caused by variations among the plurality of voltage domains. The delay circuit generates a delay output in response to the greater delay between the first portion and the second portion among the plurality of voltage domains.

The circuits and methods disclosed herein may be employed in memory systems where the timing or delay of an access path and a sense path are controlled to access memory.

Figure 2:
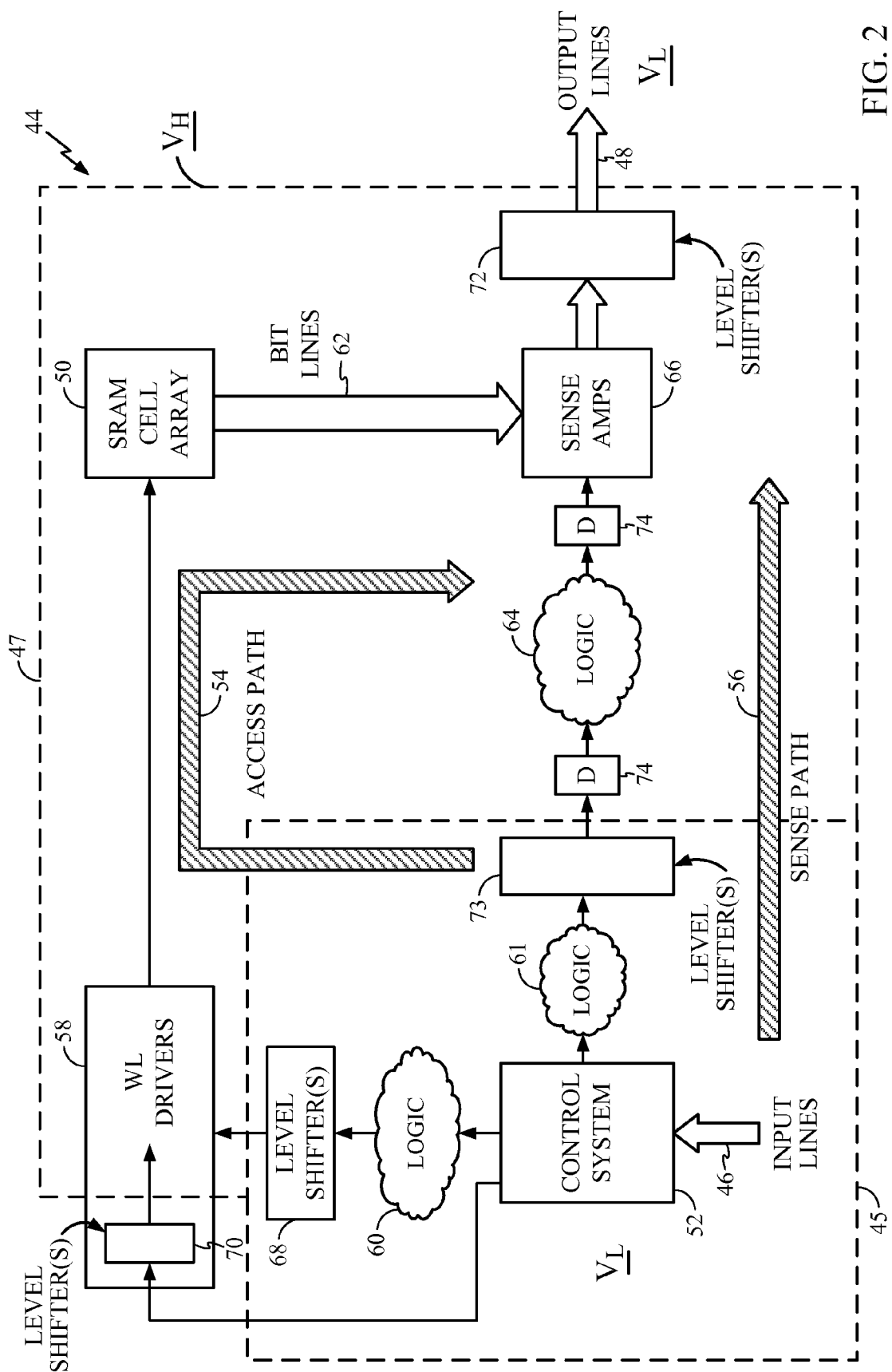
FIG. 2 is a block diagram of an exemplary memory circuit and system employing a delay element to self-tune the delay of a sense path.

Such memory systems may include processor-based systems. In this regard, FIG. 2 illustrates an exemplary memory system 44 that may employ at least one delay element to adjust the delay of a signal path to the path having the greater delay among multiple voltage domains. The memory system 44 employs static random access memory (SRAM), but any type of memory can be employed. Input lines 46 and output lines 48 are coupled to the memory system 44. The input lines 46 and output lines 48 carry signals to allow command and data communication between the memory system 44 and other system components that read data from and write data to an SRAM cell array 50. The SRAM cell array 50 operates as a mass memory device in this embodiment.

The memory system 44 contains two signal paths: an access path 54 and a sense path 56. A control system 52 is provided to communicate an access signal over the access path 54 to word line drivers 58 (i.e., row selectors). The access signals may pass through intermediary logic 60 in the access path 54. In response, the word line drivers 58 operate to activate a specific row of memory cells within the SRAM cell array 50 in response. The row in the SRAM cell array 50 may be selected for either a read or write operation. In response, data from the selected row in the SRAM cell array 50 is asserted on bit lines 62. In order to read data asserted on the bit lines 62 by the SRAM cell array 50, the control system 52 communicates a sense signal to one or more sense amplifiers 66 over the sense path 56. The sense signal may pass through intermediary logic 61, 64 in the sense path 56. In response to receipt of the sense signal, the sense amplifiers 66 perform a read on the bit lines 62 to sense the data from the bit lines 62. The sense amplifiers 66 direct the sensed data to the output lines 48 to be passed to other components or systems outside of the memory system 44.

In the memory system 44, the delay for signals to traverse the access path 54 and the sense path 56 are compatible. Specifically, the components of the memory system 44 are tuned such that a sense signal communicated over the sense path 56 does not cause the sense amplifiers 66 to sense data on the bit lines 62 before the SRAM cell array 50 asserts data on the bit lines 62. Otherwise, the sense amplifiers 66 will sense data on the bit lines 62 before the SRAM cell array 50 has asserted valid data on the bit lines 62. It is acceptable for access signals communicated over the access path 54 to reach the SRAM cell array 50 before sense signals reach the sense amplifiers 66 within a certain margin of delay. In this scenario, the data on the bit lines 62 will be present when the sense amplifiers 66 are activated. The delay of the access path 54 in the memory system 44 provides the minimum delay for which a sense signal can traverse the sense path 56 to the sense amplifiers 66.

In order to conserve power and/or to improve voltage scaling for memory system 44, two voltage domains are provided in the memory system 44. A lower voltage domain $V_L$ in a first portion 45 of the memory system 44 and a higher voltage domain $V_H$ in a second portion 47 of the memory system 44 are provided. Both the lower voltage domain $V_L$ and higher voltage domain $V_H$ are supplied with voltages from first and second voltage supplies, respectively. A lower voltage domain $V_L$ is a voltage domain that generally provides a lower voltage level than a higher voltage domain $V_H$. As an example, a standard voltage level provided by the lower voltage domain $V_L$ may be 0.75 Volts, and the standard voltage level provided by the higher voltage domain $V_H$ may be 1.1 Volts. In this example, the first portion 45 traverses in the lower voltage domain $V_L$ exclusively, and the second portion 47 traverses the higher voltage domain $V_H$ exclusively. However, a first portion and/or a second portion of the memory system 44 could be provided that traverse both the lower voltage domain $V_L$ and the higher voltage domain $V_H$. Alternatively, the first portion 45 may traverse both the lower voltage domain $V_L$ and the higher voltage domain $V_H$ and the second portion 47 may only traverse the higher voltage domain $V_H$, or vice versa. The first and second portions 45, 47 can be provided to traverse any combination of multiple voltage domains.

The voltage domains can be adjusted during operation, such as to provide voltage scaling for either hyper-performance or reduced power consumption, as examples. In this example, the input lines 46 and output lines 48 come from components provided in a lower voltage domain $V_L$. The control system 52 and intermediary logic 60, 61 are powered by the lower voltage domain $V_L$ to conserve power. Thus, components in both the access path 54 and the sense path 56 are powered by the lower voltage domain $V_L$. Thus, the delay in the access path 54 and the sense path 56 are affected by the voltage level of the lower voltage domain $V_L$. In this example, components in the access path 54 and the sense path 56 are also powered by the higher voltage domain $V_H$ in the memory system 44 of FIG. 2. The higher voltage domain $V_H$ is provided to operate the SRAM cell array 50. The SRAM cell array 50 is provided in the higher voltage domain $V_H$ to provide a minimum operating voltage level, $V_{MIN}$, independent of the lower voltage domain $V_L$, for proper SRAM cell operations. For example, $V_{MIN}$ may be 0.95 Volts. The word line drivers 58, the intermediary logic 64, and the sense amplifiers 66 are also provided in the higher voltage domain $V_H$ to enhance their performance. One or more level shifters 68, 70, 73 are provided to convert signals carried from components in the lower voltage domain $V_L$ to the higher voltage domain $V_H$. In this regard, signals from the control system 52 and passing through the intermediary logic 60, 61 in the access path 54 and the sense path 56, respectively, are level shifted from the lower voltage domain $V_L$ to the higher voltage domain $V_H$ via the one or more level shifters 68, 70, 73. Intermediary logic 64 is located in the higher voltage domain $V_H$ and thus does not need to be level shifted. Another level shifter 72 is provided to shift the output lines 48 from the higher voltage domain $V_H$ back to the lower voltage domain $V_L$.

Providing an independent lower voltage domain $V_L$ and higher voltage domain $V_H$ allows the lower voltage domain $V_L$ to be dynamically adjusted, such as via dynamic voltage scaling (DVS) techniques for example, to either conserve power or allow hyper-performance. The lower voltage domain $V_L$ may be scaled down or collapsed during standby modes to conserve standby power. If further performance enhancements are desired, the higher voltage domain $V_H$ can be raised to provide a higher operating voltage level than $V_{MIN}$.

The performance (i.e., speed) of components are affected by their operating voltage level. Generally, a higher operating voltage level results in less delay and faster performance. Generally, a lower operating voltage level results in more delay and slower performance. Thus, the timing of the access path 54 and the sense path 56 is designed with the voltage domains in mind so that the access path 54 has the same or less delay than the sense path 56. Otherwise, the sense amplifiers 66 will sense data on the bit lines 62 before valid data is asserted on the bit lines 62 by the SRAM cell array 50. Because the voltage level in a voltage domain can undergo variations due to variations in a power supply, the delay in the access path 54 and the sense path 56 can change during operation as a result. When providing multiple voltage domains, voltage level variations in either the lower voltage domain $V_L$, the higher voltage domain $V_H$, or both can contribute to delay variations in the access path 54 and the sense path 56. Natural tolerances between level shifters 68, 70, and/or 73 can also cause additional variations in delays that contribute to overall delay variations in the access path 54 and the sense path 56.

If voltage level variations occur in the access path 54 and/or the sense path 56 such that the delay of the sense path 56 increases relative to the delay of the access path 54, the memory system 44 still operates properly. In this case, the SRAM cell array 50 will still place data on the bit lines 62 before the sense amplifiers 66 sense the data on the bit lines 62. However, if voltage level variations occur such that the delay of the sense path 56 decreases relative to the delay of the access path 54, the memory system 44 may be inoperable. In this case, the sense amplifiers 66 may be activated to sense data on the bit lines 62 before valid data is placed on the bit lines 62 by the SRAM cell array 50. For this reason, the memory system 44 is designed to provide a delay margin for the sense path 56. A delay margin is an amount of delay by which the delay of the sense path 56 can decrease relative to the access path 54 and the memory system 44 still property function (i.e., valid data is present on bit lines 62 when the sense amplifiers 66 sense data on the bit lines 62). Delay margin comes with a trade off. Delay margin decreases performance of the memory system 44 by increasing the delay of the sense path 56. Performance is decreased for all operating conditions even though voltage level variations may cause decrease in the delay of the sense path 56 at certain limited times or conditions. Thus, it is desirable to limit the delay margin for the sense path 56 as much as possible to maximize performance of the memory system 44 without rendering the memory system 10 inoperable.

Even with delay margin provided for the sense path 56, the voltage levels in the lower voltage domain $V_L$ or the higher voltage domain $V_H$ may still vary such that the delay of the sense path 56 relative to the access path 54 decreases greater than the delay margin. In these cases, the memory system 44 will be inoperable. The decreased delay of the sense path 54 will cause the sense amplifiers 66 to sense data on the bit lines 62 before valid data is asserted on the bit lines 62 by the SRAM cell array 50. Delay margin of the sense path 56 can be increased, but performance is sacrificed as a result. It may not be possible to provide enough delay margin to allow for proper operation of the memory system 44 in all operating conditions while achieving acceptable performance.

To address this issue, one or more delay circuits 74 are provided in the sense path 56, as illustrated in FIG. 2. One or more delay circuits 74 are configured to self-tune the delay in the sense path 56. By self-tune, it is meant that the delay in the sense path 56 is self-adjusting. The delay in the sense path 56 is prevented from being less than the delay in the access path 54. Otherwise, the sense amplifiers 66 may sense data from the bit lines 62 before the SRAM cell array 50 asserts valid data on the bit lines 62 in certain operating circumstances. One or more delay circuits 74 are configured to adjust delay dynamically during operation of the memory system 44.

Figure 3:
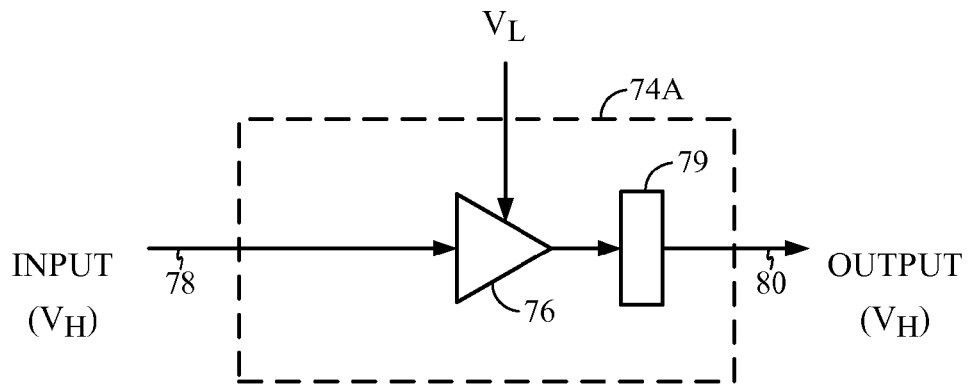
FIG. 3 is a block diagram of an exemplary delay element for self-tuning delay of a signal according to the greater delay path among a lower voltage domain.

FIG. 3 illustrates one example of a delay circuit 74A that may be coupled inline in the sense path 56 of the memory system 44 of FIG. 2. The memory system 44 of FIG. 2 shows two possible locations for delay circuits 74 in the sense path 56. The delay circuits 74 can be provided in the sense path 56 before intermediary logic 64, after intermediary logic 64, or before and after intermediary logic 64. However, the delay circuits 74 may be provided anywhere in the sense path 56. As illustrated in FIG. 3, the delay circuit 74A includes a delay element which is exemplified by buffer 76. An input signal 78 configured to carry a sense signal in the higher voltage domain $V_H$ in the sense path 56 is coupled to the input of the buffer 76. The buffer 76 adds delay to the sense signal passing through the sense path 56. The operating voltage powering the buffer 76 is provided by a voltage supply powering the lower voltage domain $V_L$. In this manner, the delay circuit 74A is configured to generate a delay output 80 from the buffer 76, and thus the delay of the sense path 56, that is only gated by the path having the greater delay in the lower voltage domain $V_L$. One or more level shifters 79 may be provided to shift the voltage level of the output of the buffer 76 to the higher voltage domain $V_H$. The path of greater delay is often in the lower voltage domain $V_L$. Thus, if a delay or slow down occurs due to variances in the lower voltage domain $V_L$ during operation of the memory system 44, the delay output 80 of the buffer 76 will be dynamically gated to the path of greater delay in the lower voltage domain $V_L$. Thus, the delay of the sense path 56 will be increased according to the delay or slow down caused by the lower voltage domain $V_L$. This prevents exhaustion of the delay margin in the sense path 56, wherein the delay in the sense path 56 is lower than the delay in the access path 54.

The delay circuit 74A illustrated in FIG. 3 can adjust the delay of the sense path 56 in response to a delay or slow down caused by the lower voltage domain $V_L$. However, the delay circuit 74A cannot increase the delay of the sense path 56 in response to a delay or slow down caused by the higher voltage domain $V_H$. An effective slow down can occur in the higher voltage domain $V_H$ even if the voltage level of the higher voltage domain $V_H$ does not decrease. In some situations, the lower voltage domain $V_L$ may provide a higher voltage level than the higher voltage domain $V_H$. Thus, the higher voltage domain $V_H$ may be slower than the lower voltage domain $V_L$ in this instance depending on the design of a given circuit.

Figure 4:
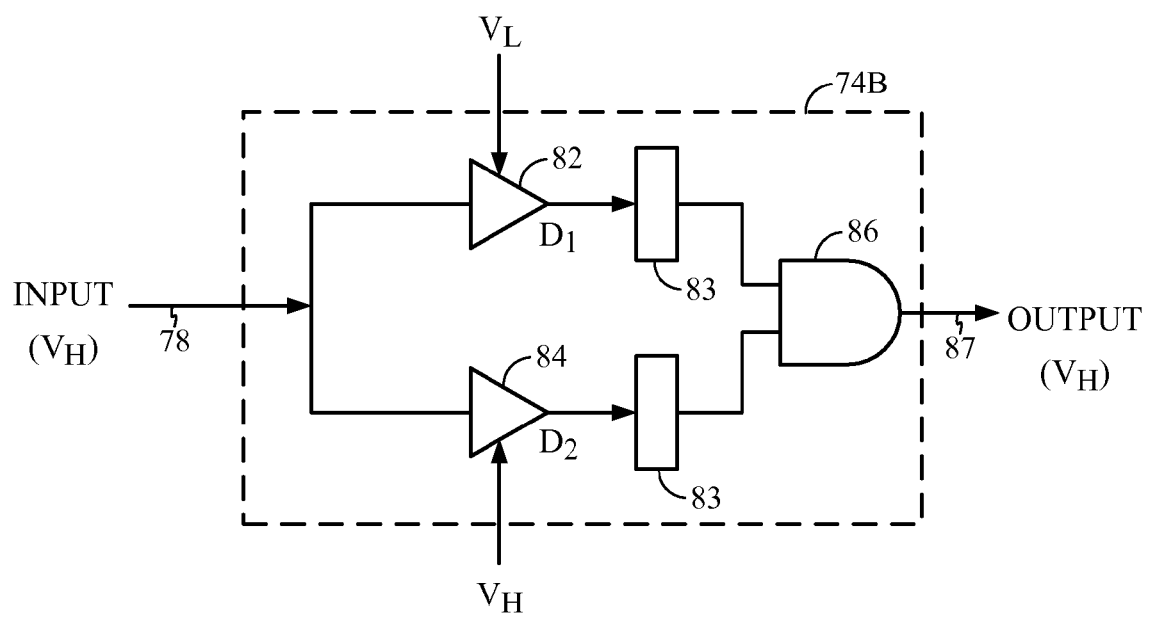
FIG. 4 is a block diagram of an alternative exemplary delay element for self-tuning delay of a signal according to the greater delay path among multiple voltage domains.

The delay circuit 74B in FIG. 4 adjusts for situations where either the path of greater delay is caused by either the lower voltage domain $V_L$ or the higher voltage domain $V_H$. As illustrated in FIG. 4, a delay circuit 74B is coupled inline in the sense path 56 and configured to dynamically adjust or self-tune delay in the sense path 56. The delay circuit 74B is configured to generate a delay output 87 to dynamically adjust or self-tune delay in the sense path 56 due to a delay or slow down caused by either the lower voltage domain $V_L$ or the higher voltage domain $V_H$. In the delay circuit 74B of FIG. 4, first and second delay elements exemplified as first buffer 82 and second buffer 84, respectively, are coupled in parallel. The input signal 78 configured to carry a sense signal is coupled to inputs of the first and second buffers 82, 84. The first buffer 82 is powered by a first voltage supply providing power to the lower voltage domain $V_L$ just as provided in the delay circuit 74A of FIG. 3. One or more level shifters 83 may be provided to shift the voltage level of the output of the first and second buffers 82, 84 to the higher voltage domain $V_H$. However, the second buffer 84 is powered by a second voltage supply providing power to the higher voltage domain $V_H$. The outputs of the first and second buffers 82, 84 are input into a combining circuit exemplified as combining gate 86, which in one embodiment may be an AND gate. The delay output 87 of the combining gate 86 carries a sense signal provided on the input signal 78 to the sense amplifiers 66 in the sense path 56. By providing first and second buffers 82, 84 that are powered by both voltage domains, the delay output 87 of the first and second buffers 82, 84, and thus the delay of the sense path 56, will be gated by the path of greater delay caused by either the lower voltage domain $V_L$ or the higher voltage domain $V_H$. Thus, the delay circuit 74B is capable of dynamically adjusting or self-tuning the delay in the sense path 56 regardless of whether the lower voltage domain $V_L$ caused the path of greater delay relative to the higher voltage domain $V_H$, or the higher voltage domain $V_H$ caused the path of greater delay relative to the lower voltage domain $V_L$.

Figure 5:
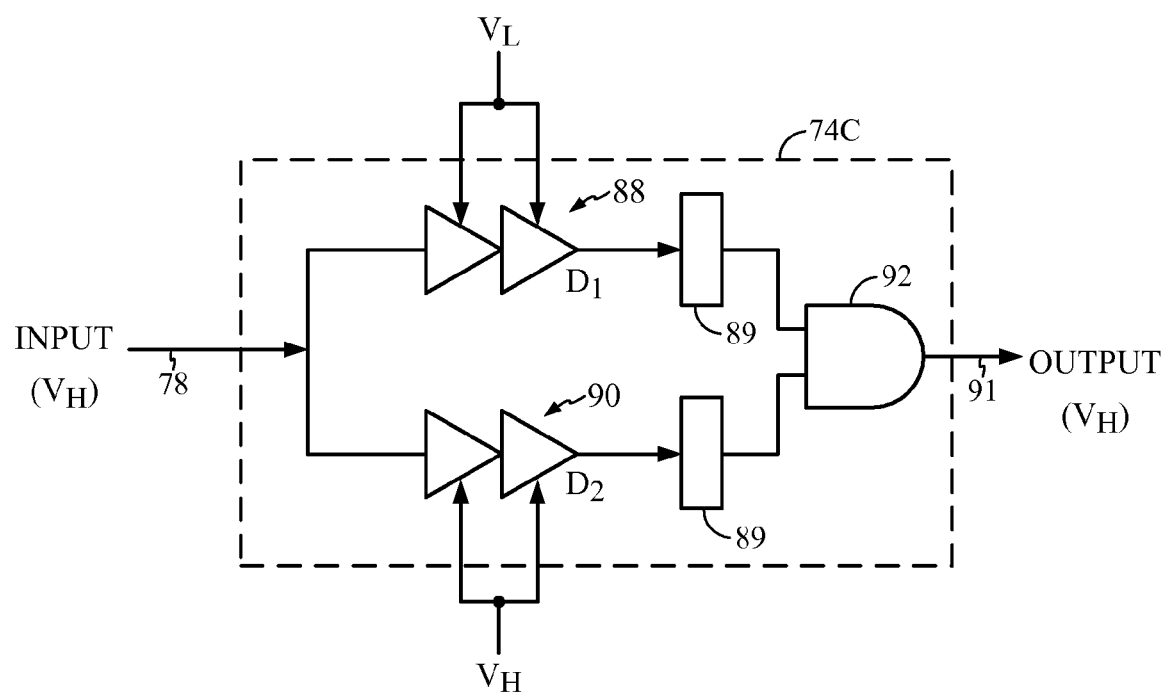
FIG. 5 is a block diagram of another alternative exemplary delay element for self-tuning delay of a signal according to the greater delay path among multiple voltage domains.

FIG. 5 illustrates another example of a delay circuit 74. Therein, a delay circuit 74C is provided that is similar to the delay circuit 74B illustrated in FIG. 4, except that additional buffers are provided to further increase delay in the sense path 56. A first set of delay elements exemplified as buffers 88 coupled in a series chain is provided and powered by the lower voltage domain $V_L$ to provide delay buffers. A second set of delay elements exemplified as buffers 90 coupled in a series chain and powered by the higher voltage domain $V_H$ is coupled in parallel to the first set of buffers 88. The input signal 78 configured to carry a sense signal on the sense path 56 is coupled to inputs of the first set of buffers 88 and the second set of buffers 90. The outputs of the first and second sets of buffers 88, 90 are coupled to the inputs of a combining circuit exemplified by combining gate 92, which in one embodiment may be an AND gate. One or more level shifters 89 may be provided to shift the voltage level of the output of the first and second sets of buffers 88, 90 to the higher voltage domain $V_H$. A delay output 91 of the combining gate 92 carries a sense signal provided on the input signal 78 to the sense amplifiers 66 in the sense path 56. As provided in the delay circuit 74B of FIG. 4, by providing the first and second sets of buffers 88, 90 that are powered by both voltage domains, the delay output 91 of the first and second sets of buffers 88, 90, and thus the delay of the sense path 56, will be gated by the path of greater delay caused by either the lower voltage domain $V_L$ or the higher voltage domain $V_H$. Thus, the delay circuit 74C is capable of dynamically adjusting or self-tuning the delay in the sense path 56 regardless of whether the lower voltage domain $V_L$ caused the path of greater delay relative to the higher voltage domain $V_H$, or the higher voltage domain $V_H$ caused the path of greater delay relative to the lower voltage domain $V_L$.

Figure 6:
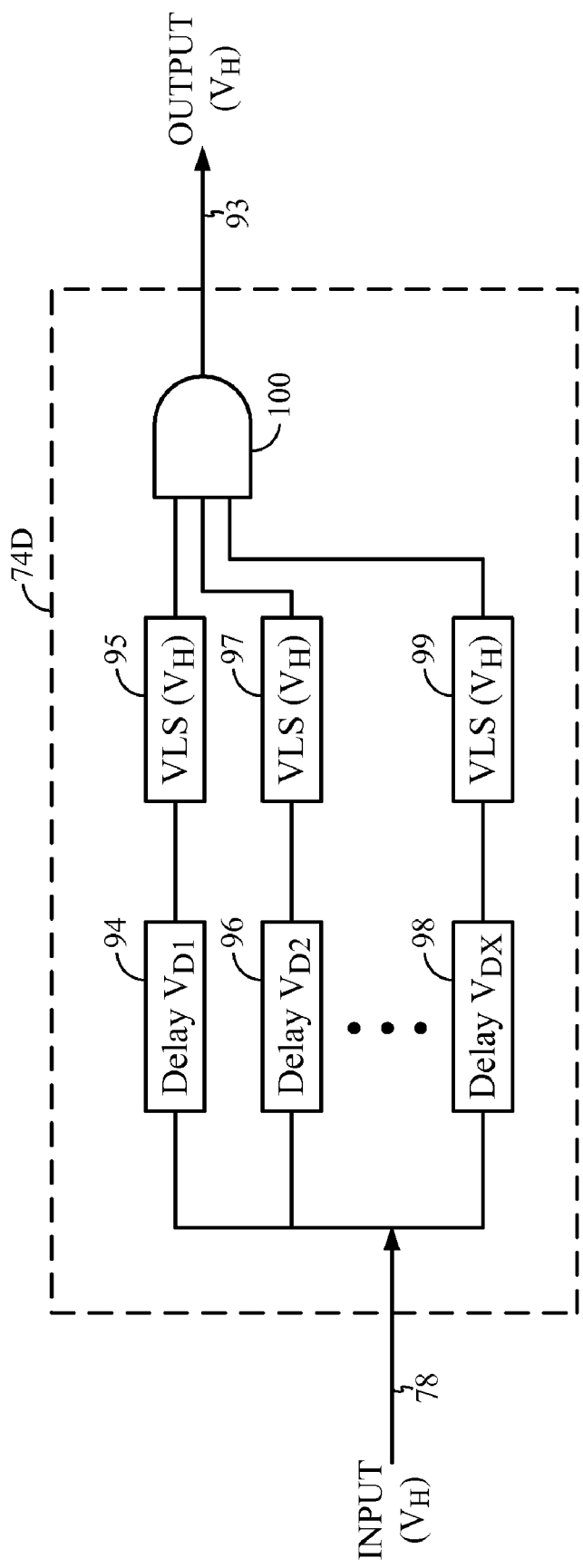
FIG. 6 is a block diagram of another alternative exemplary delay element for self-tuning delay of a signal according to the greater delay path among multiple voltage domains.

FIG. 6 illustrates another example of a delay circuit 74 that may be provided in the sense path 56. A delay circuit 74D generates a delay output 93 according to the slowest delay among a plurality of voltage domains. The delay circuit 74D illustrated in FIG. 6 is configured to provide for mixing delay between more than two voltage domains; however, this delay circuit 74D may be provided in a dual voltage domain system, such as the memory system 44 illustrated in FIG. 2. A plurality of delay elements 94, 96, 98 to provide a plurality of delay chains (i.e., one delay elements, or a plurality of delay elements provided in series), each powered by a different voltage domain, are each driven by the input signal 78. The resulting delay chains are then level shifted via level shifters 95, 97, 99 to the higher voltage domain $V_H$ and each provide an input to a combining circuit exemplified by combining gate 100, which in one embodiment may be an AND gate. In this manner, the voltage domains are mixed with the delay of the slowest delay gating the output of the combining gate 100. The delay output 93 of the combining gate 100 controls and adjusts the delay of the sense signal according to the path having the greater delay among the voltage domains.

The self-tuning delay circuit and related methods described herein may be used in any circuit or system, including but not limited to a memory circuit or system. If employed in a memory circuit or system, the memory circuit or system may employ any type of memory. Examples include, without limitation, SRAM, dynamic RAM (DRAM), synchronous DRAM (SDRAM), data-double-rate (DDR) SDRAM, data-double-rate-two (DDR2) SDRAM, data-double-rate-three (DDR2) SDRAM, Mobile DDR (MDDR) SDRAM, low-power (LP) DDR SDRAM, and LP DDR2 SDRAM. Any of the components of a memory circuit or system employing the self-tuning delay circuit may be provided in any voltage domain among a plurality of voltage domains as long as the memory is powered by a voltage domain providing a sufficient voltage level to keep the memory cell functional, if required by the technology and/or design of the memory.

Figure 7:
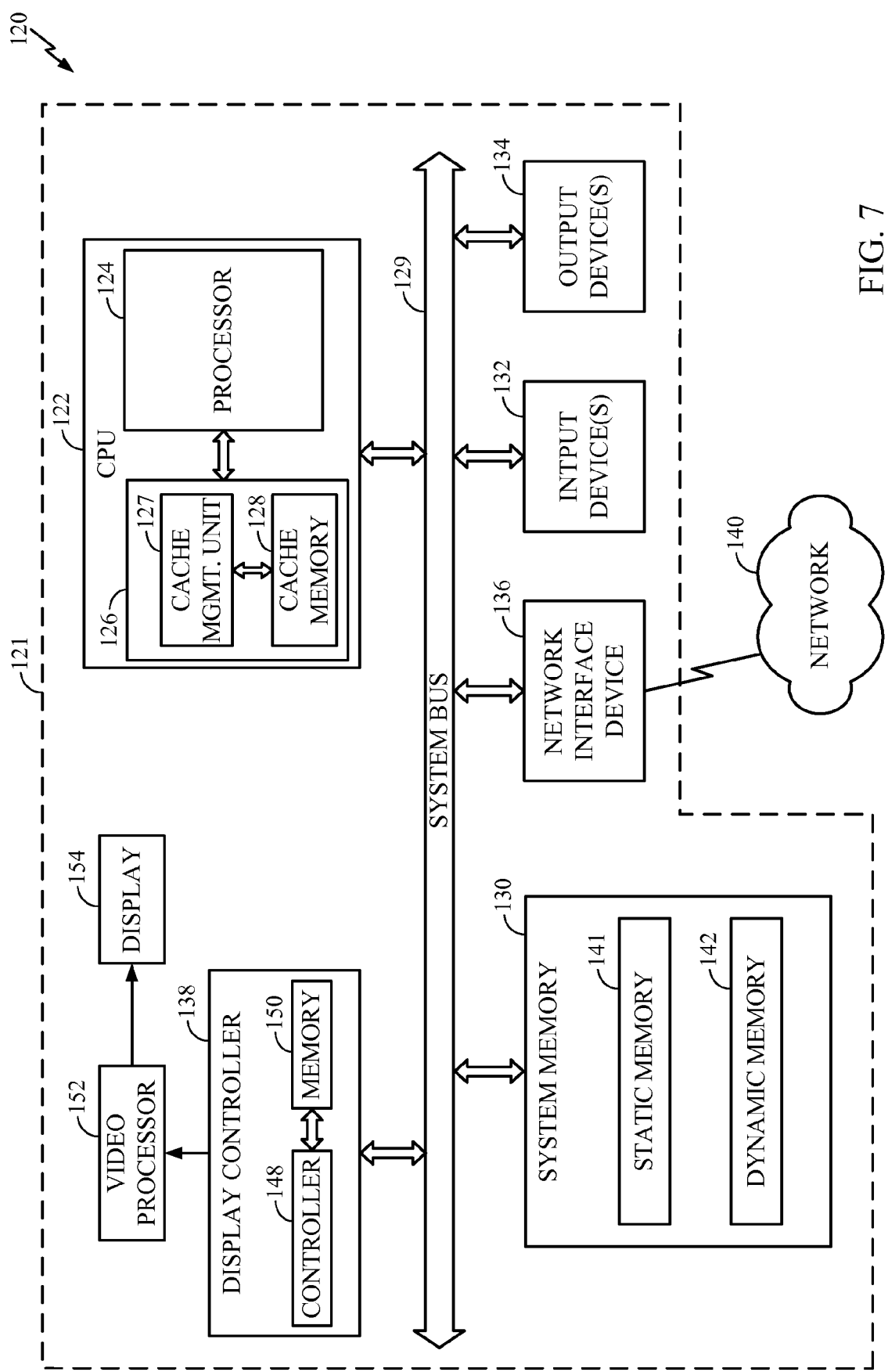
FIG. 7 is a block diagram of an exemplary processor-based system in which the circuit and methods according to the embodiments described herein may be provided.

FIG. 7 illustrates a processor-based system 120 that may employ the circuits and systems described above. The processor-based system 120 may be included in an electronic device 121. The processor-based system 120 includes a central processing unit (CPU) 122 that includes a processor 124 and an integrated cache system 126. The cache system 126 includes a cache management unit 127 controls access to a cache memory 128 accessible to the processor 124 for rapid access to temporary storage for frequently accessed data. The cache memory 128 may employ the circuits and methods described above. The CPU 122 is coupled to the system bus 129, which interconnects the other devices included in the processor-based system 120. As is well known, the CPU 122 communicates with these other devices by exchanging address, control, and data information over the system bus 129. These devices may include any types of devices. As illustrated in FIG. 7, these devices may include system memory 130, one or more input devices 132, one or more output devices 134, a network interface device 136, and a display controller 138, as examples.

The input devices 132 may include any type of input device, including but not limited to input keys, switches, voice processors, etc. The output devices 134 may include any type of output device, including but not limited to audio, video, other visual indicators, etc. The network interface device 136 may be any device configured to allow exchange of data to and from a network 140. The network 140 may be any type of network, including but not limited to a wired or wireless network, private or public network, a local area network (LAN), a wide local area network (WLAN), and the Internet. The network interface device 136 may support any type of communication protocol desired.

The CPU 122 may also access system memory 130 over the system bus 31. The system memory 130 may include circuits and methods previously described above to access the system memory 130. The system memory 130 may include static memory 141 and/or dynamic memory 142. The system memory 130 may include a program store 144 and a data store 146 for the CPU 122. The CPU 122 may also access the display controller 138 over the system bus 31 to control information sent to a display 154. The display controller 138 may include a memory controller 148 and memory 150 to store data to be sent to the display 154 in response to communications with the CPU 122. The display controller 138 sends information to the display 154 to be displayed via a video processor 152, which processes the information to be displayed into a format suitable for the display 154. The display 154 may include any type of display, including but not limited to a cathode ray tube (CRT), a liquid crystal display (LCD), a plasma display, etc.

A circuit according to embodiments disclosed herein may also be provided in any electronic device for controlling a signal path, including but not limited to a signal path for access memory. Such electronic devices may employ a processor-based system like or including one or more components of the processor-based system 120 of FIG. 7. Examples of such electronic devices include, without limitation, mobile phones, cellular phones, computers, portable computers, desktop computers, personal digital assistants (PDAs), monitors, computer monitors, televisions, tuners, radios, satellite radios, digital music players, portable music players, digital video players, digital video disc (DVD) players, and portable digital video players.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit, comprising:
   a plurality of voltage domains;
   a plurality of paths;
   wherein each of the plurality of paths traverses a portion of the plurality of voltage domains and has a delay responsive to at least one of the plurality of voltage domains; and
   a delay circuit configured to generate a delay output related to the delay of the plurality of paths.

2. The circuit of claim 1, wherein the delay circuit is configured to produce the delay output according to a delay of a first path and a delay of a second path among the plurality of paths.

3. The circuit of claim 1, wherein the delay circuit is comprised of at least one gate configured to generate the delay output.

4. The circuit of claim 1, wherein the delay circuit is comprised of:
   one or more first delay elements whose voltages are supplied by a first voltage supply among the plurality of voltage domains and are configured to generate one or more first outputs;
   one or more second delay elements whose voltages are supplied by the second voltage supply among the plurality of voltage domains and configured to generate one or more second outputs; and
   at least one combining circuit configured to generate the delay output in response to receipt of the one or more first outputs and the one or more second outputs.

5. The circuit of claim 4, wherein the one or more first delay elements and one or more second delay elements are each comprised of one or more buffers.

6. The circuit of claim 1, further comprising at least one level shifter in one or more of the plurality of paths.

7. The circuit of claim 1, wherein the plurality of voltage domains comprises a lower voltage domain and a higher voltage domain.

8. The circuit of claim 7, wherein each of the plurality of paths traverses both the lower voltage domain and the higher voltage domain.

9. The circuit of claim 7, wherein a first path among the plurality of paths traverses the lower voltage domain, and a second path among the plurality of paths traverses the higher voltage domain.

10. The circuit of claim 1, wherein a first path among the plurality of paths is comprised of a sense path, and a second path among the plurality of paths is comprised of an access path coupled to at least one memory cell.

11. The circuit of claim 1, wherein the circuit is used in an electronic device comprised from the group consisting of a mobile phone, a cellular phone, a computer, a portable computer, a desktop computer, a personal digital assistant (PDA), a monitor, a computer monitor, a television, a tuner, a radio, a satellite radio, a digital music player, a portable music player, a digital video player, a digital video disc (DVD) player, and a portable digital video player.

12. A delay circuit, comprising:
a plurality of voltage domains;
a plurality of paths;
wherein each of the plurality of paths traverses a portion of the plurality of voltage domains and has a delay responsive to at least one of the plurality of voltage domains; and
a means for producing a delay output related to the delay of the plurality of paths.

13. A method of producing a delay output in a delay circuit, comprising:
receiving a plurality of signals from a plurality of paths traversing a portion of a plurality of voltage domains, wherein the plurality of paths has a delay response to at least one of the plurality of voltage domains;
delaying each of the plurality of signals related to the delay of a corresponding path of the plurality of paths; and
generating a delay output from a delay circuit receiving the plurality of signals.

14. The method of claim 13, wherein delaying the plurality of signals further comprises delaying a received first signal among the plurality of signals in a first path among the plurality of paths according to a delay in a second path among the plurality of paths.

15. The method of claim 13, wherein generating the delay output comprises generating at least one gate output from the delay circuit receiving the plurality of signals.

16. The method of claim 13, wherein generating the delay output comprises:
delaying a received first signal among the plurality of signals using one or more first delay elements whose voltages are supplied by a first voltage supply among the plurality of voltage domains;
delaying the received first signal using one or more second delay elements whose voltages are supplied by a second voltage supply among the plurality of voltage domains; and
combining the delayed first signal from the one or more first delay elements and the delayed first signal from the one or more second delay elements.

17. The method of claim 13, wherein receiving the plurality of signals comprises receiving the plurality of signals over both a lower voltage domain and a higher voltage domain among the plurality of voltage domains.

18. A memory system, comprising:
a control system;
a plurality of voltage domains;
a sense path traversing a first portion of the plurality of voltage domains and having a first delay responsive to the first portion;
an access path traversing a second portion of the plurality of voltage domains having a second delay responsive to the second portion; and
a delay circuit coupled to the sense path and configured to produce a delay output related to the first and second delays.

19. The memory system of claim 18, wherein the delay circuit is comprised of a plurality of delay elements each configured to generate the delay output.

20. The memory system of claim 18, wherein the delay circuit is comprised of:
one or more first delay elements whose voltages are supplied by a first voltage supply among the plurality of voltage domains and are configured to generate one or more first outputs;
one or more second delay elements whose voltages are supplied by the second voltage supply among the plurality of voltage domains and are configured to generate one or more second outputs; and
at least one combining circuit configured to generate the delay output in response to receipt of the one or more first outputs and the one or more second outputs.

21. The memory system of claim 18, wherein the plurality of voltage domains comprises a lower voltage domain and a higher voltage domain.

22. The memory system of claim 18, further comprising a plurality of sense amplifiers configured to receive the delay output.

23. The memory system of claim 22, wherein the plurality of sense amplifiers are configured to sense data from bit lines output from a memory cell array.

24. The memory system of claim 18, wherein the memory system is included in an electronic device comprised from the group consisting of a mobile phone, a cellular phone, a computer, a portable computer, a desktop computer, a personal digital assistant (PDA), a monitor, a computer monitor, a television, a tuner, a radio, a satellite radio, a digital music player, a portable music player, a digital video player, a digital video disc (DVD) player, and a portable digital video player.

* * * * *